United States Patent [19]

Iga

[11] Patent Number: 5,581,214

[45] Date of Patent: Dec. 3, 1996

[54] PHASE-LOCKED LOOP CIRCUIT

[75] Inventor: Tetsuya Iga, Sagamihara, Japan

[73] Assignee: Mitsubishi Denki Kabushiki Kaisha, Tokyo, Japan

[21] Appl. No.: 521,587

[22] Filed: Aug. 30, 1995

[30] Foreign Application Priority Data

Sep. 5, 1994 [JP] Japan ................................. 6-211309

[51] Int. Cl.$^6$ .............................. H03L 3/00; H03L 7/10; H03L 7/16
[52] U.S. Cl. .............................. 331/16; 331/1 A; 331/8; 331/25; 327/107; 327/159
[58] Field of Search ................. 331/1 A, 8, 16, 331/18, 25; 327/105, 107, 156, 158, 159; 455/260; 375/376; 360/51

[56] References Cited

U.S. PATENT DOCUMENTS

| | | | |
|---|---|---|---|
| 4,105,946 | 8/1978 | Ikeda | 331/16 X |
| 4,667,169 | 5/1987 | Matsuura et al. | 331/16 X |
| 4,673,892 | 6/1987 | Miyashita et al. | 331/16 X |
| 5,113,152 | 5/1992 | Norimatsu | 331/16 X |
| 5,339,278 | 8/1994 | Irwin et al. | 331/16 |
| 5,448,195 | 9/1995 | Iga et al. | |
| 5,459,755 | 10/1995 | Iga et al. | |
| 5,497,126 | 3/1996 | Kosiec et al. | 331/16 X |

*Primary Examiner*—David Mis
*Attorney, Agent, or Firm*—Oblon, Spivak, McClelland, Maier & Neustadt, P.C.

[57] ABSTRACT

A timing generating circuit (9) receives a reference signal ($f_{REF}$) and an operation control signal ($S_0$) as inputs and outputs a generation control signal ($S_1$). The generation control signal ($S_1$) is inputted to the prescaler (31), the programmable divider (41) and a phase comparator (51). The generation control signal ($S_1$) goes "H" when the operation control signal ($S_0$) goes "H" and then the reference signal ($f_{REF}$) is counted predetermined times, and a raw signal ($f_{RAW}$) is divided to start generating a signal to be measured ($f_0$) after the generation control signal ($S_1$) goes "H", so that a phase difference $\delta$ between the reference signal ($f_{REF}$) and the signal to be measured ($f_0$) at the start is constant irrespective of the timing of the operation control signal ($S_0$) attaining "H". Accordingly, it is not necessary to set the timing of the operation control signal ($S_0$) attaining "H" considerably earlier prior to a period required in the time-division telegraphy, and the power consumption of a prescaler (31) and a programmable divider (41) are suppressed.

15 Claims, 14 Drawing Sheets

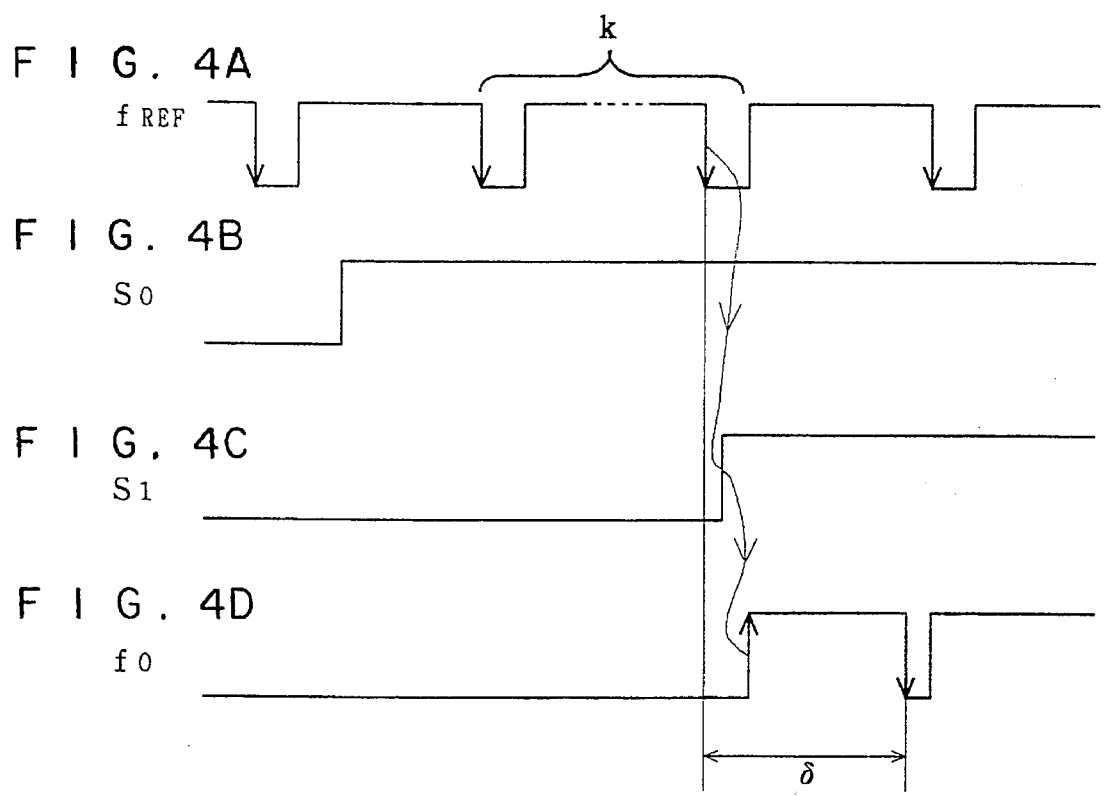

F I G. 5A
f REF
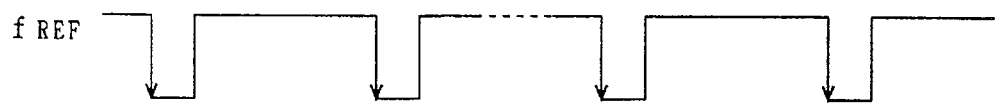
F I G. 5B
S0
F I G. 5C
S1
F I G. 5D
fo

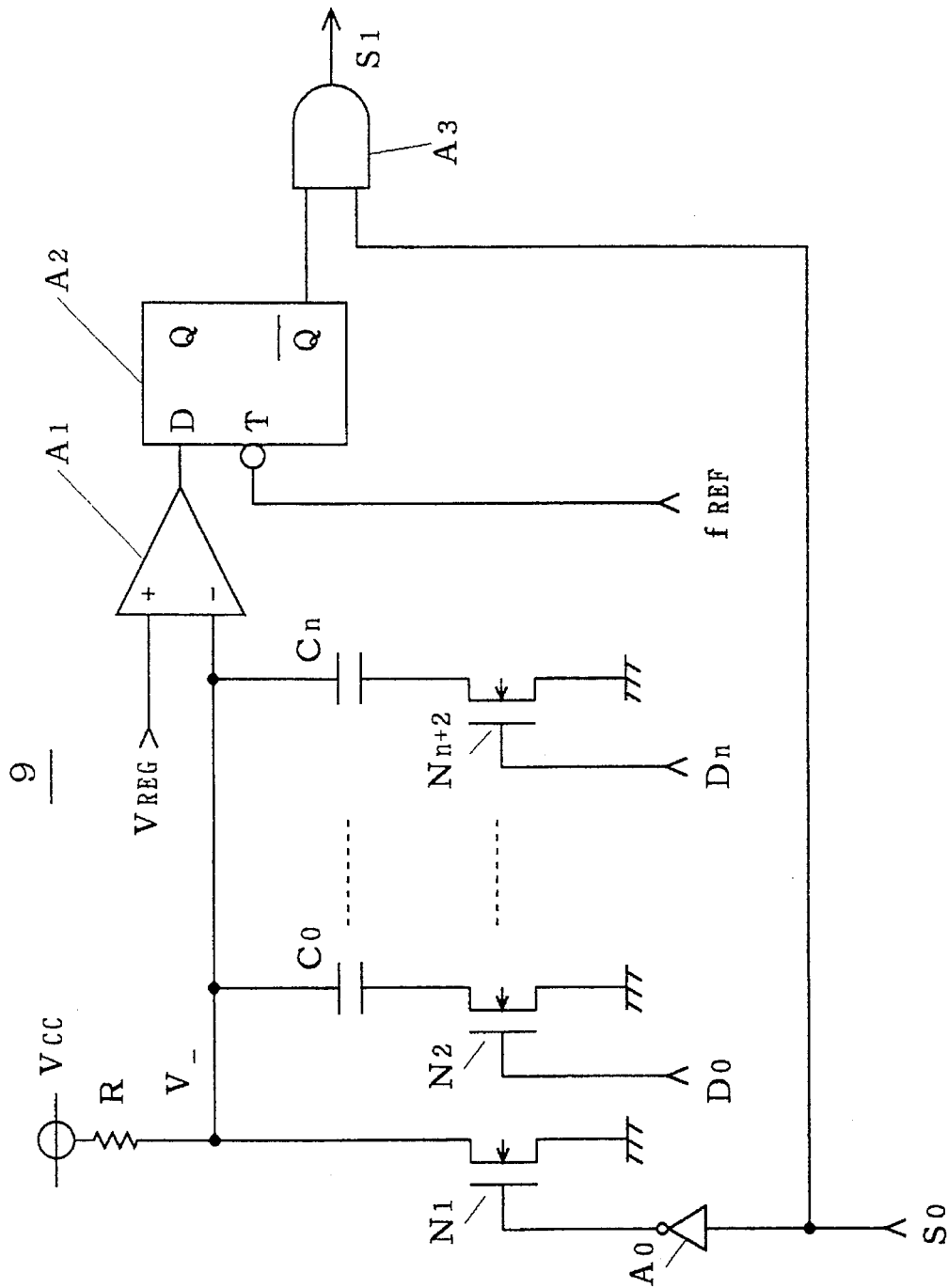

OUTPUT OF
COMPARATOR A1

$\bar{Q}$ OUTPUT OF
D FLIP-FLOP A2

PHASE-LOCKED LOOP CIRCUIT

BACKGROUND OF THE INVENTION

1. Field of the Invention

The present invention relates to phase-locked loop circuits, and particularly to technique for reducing a time required for lock-up of the phase-locked loop circuit which operates intermittently.

2. Description of the Background Art

FIG. 13 is a block diagram showing the structure of a conventional phase-locked loop circuit 200. A reference oscillator 1 outputs oscillation signal having a constant frequency which is relatively low. This is divided by a reference divider 2 and then a reference signal $f_{REF}$ having a constant frequency is obtained.

A voltage-controlled oscillator 8 outputs a raw signal $f_{RAW}$ having a relatively high frequency, which is divided by a prescaler 3 and a programmable divider 4 at a certain ratio to be a signal to be measured $f_0$. The phase-locked loop circuit 200 makes control so that the signal to be measured $f_0$ always has the same frequency as that of the reference signal $f_{REF}$ to stabilize the frequency of the raw signal $f_{RAW}$ having the relatively high frequency.

The reference signal $f_{REF}$ and the signal to be measured $f_0$ are inputted to a phase difference detecting means composed of a phase comparator 5, a charge pump 6 and a low-pass filter 7. Then, a phase difference voltage $V_P$ is provided to the voltage-controlled oscillator 8 on the basis of a phase difference between the reference signal $f_{REF}$ and the signal to be measured $f_0$. The voltage-controlled oscillator 8 outputs the raw signal $f_{RAW}$ having a frequency based on the phase difference voltage.

Accordingly, changing the frequency of the signal to be measured $f_0$ so that the phase difference between the reference signal $f_{REF}$ and the signal to be measured $f_0$ disappears makes the frequency of the signal to be measured $f_0$ equal to that of the reference signal $f_{REF}$. It is easy to stabilize the frequency of the reference signal $f_{REF}$ having the relatively low frequency, and further, the stability of the raw signal $f_{RAW}$ having the relatively high frequency is enhanced by using the phase-locked loop circuit 200.

Such a phase-locked loop circuit is used to apply the raw signal $f_{RAW}$ to a frequency synthesizer unit for transmit/receive of a portable telephone, for example. In the portable telephone in which the time-division telegraphy is performed, for example, the raw signal $f_{RAW}$ is not always required for the frequency synthesizer unit for transmit/receive.

It is necessary to divide the raw signal $f_{RAW}$ to generate the signal to be measured $f_0$ as described above to stabilize the raw signal $f_{RAW}$ with the relatively high frequency in reference to the reference signal $f_{REF}$ which is stable because of its relatively low frequency.

Now, an ECL circuit with bipolar transistor is usually required to divide a high frequency. However, since the ECL circuit has large consumption power, dividing is performed in two steps, where only the prescaler 3 for dividing to a frequency which can be processed by a divider composed of CMOS circuitry having small consumption power is composed of ECL circuitry and dividing thereafter is made by the programmable divider 4 composed of CMOS circuitry, for example.

Accordingly, most of the power consumed in the phase-locked loop circuit is the power consumed in the prescaler 3 composed of the ECL circuitry. Therefore, an attempt is made to reduce the consumption power by turning ON/OFF the prescaler 3 to match with the time-division telegraphy. An operation control signal $S_O$ inputted to the prescaler 3 controls ON/OFF of the operation of the prescaler 3.

However, while ON/OFF of the operation of the prescaler 3 is controlled by the operation control signal $S_O$, the timing of activation of the operation control signal $S_O$ (turning-on of the operation of the prescaler 3) with respect to the reference signal $f_{REF}$ is indefinite. This is because the phase of the reference signal $f_{REF}$ and the timing of the time-division telegraphy has no relation.

FIG. 14 is a timing chart showing the relation among the reference signal $f_{REF}$, the signal to be measured $f_0$ and the operation control signal $S_O$ in the phase-locked loop circuit 200. When the operation control signal $S_O$ goes "H" and then the operation of the prescaler 3 turns on, the prescaler 3 starts dividing the raw signal $f_{RAW}$. While it is further divided by the programmable divider 4 to be the signal to be measured $f_0$, there is a difference in phase (or time) δ between the timing of the first transition of the signal to be measured $f_0$ from "H" to "L" and the timing of the transition of the reference signal $f_{REF}$.

Now, the phase (or time) δ is indefinite depending on the timing of activation of the operation control signal $S_O$ with respect to the reference signal $f_{REF}$. Accordingly, a time required to match the frequency of the signal to be measured $f_0$ with that of the reference signal $f_{REF}$, i.e., to lock up, is indefinite.

It is necessary to intermittently transmit and receive at predetermined intervals and with predetermined lengths in the time-division telegraphy, and the frequency of the signal to be measured $f_0$ must be matching with that of the reference signal $f_{REF}$ in the periods of transmission and reception. Accordingly, the operation control signal $S_O$ must be activated prior to the time of transmission and reception by a time longer enough than the phase (or time) δ. It means that the prescaler 3 consumes power in a period longer than the period of transmission and reception.

As described above, when the conventional phase-locked loop circuit 200 is used, there is a problem that the power consumption of the prescaler 3 can not be suppressed enough.

SUMMARY OF THE INVENTION

According to a first aspect of the present invention, a phase-locked loop circuit comprises: (a) raw signal generating means receiving a reference signal and a signal to be measured as inputs for detecting a phase difference of the signal to be measured with respect to the reference signal and generating a raw signal having a frequency based on the phase difference; and (b) signal to be measured generating means receiving an operation control signal and the reference signal and turned on/off by the operation control signal for generating the signal to be measured from the raw signal triggered by a pulse of the reference signal obtained first after turned on.

Preferably, according to the phase-locked loop circuit according to a second aspect of the present invention, the signal to be measured generating means comprises, (b-1) a timing generating circuit receiving the operation control signal and the reference signal for outputting a generation control signal triggered by a pulse of the reference signal obtained first after a predetermined period passes after the operation control signal is activated, and (b-2) a divider receiving the generation control signal for dividing the raw signal to generate the signal to be measured.

Preferably, according to the phase-locked loop circuit according to a third aspect of the present invention, the raw signal generating means comprises, (a-1) a phase difference detector for outputting a phase difference voltage based on the phase difference only when the generation control signal is active, and (a-2) a voltage-controlled oscillator for generating the raw signal on the basis of the phase difference voltage.

Preferably, according to a fourth aspect of the present invention, the timing generating circuit counts the reference signal predetermined times and outputs the generation control signal.

According to the phase-locked loop circuit of the first aspect, the timing of the first transition of the continuous signal to be measured and the timing of a transition of the reference signal are constant irrespective of the timing of activation of the operation control signal.

In the phase-locked loop circuit of the first aspect, the period of activation of the operation control signal can be shortened to decrease the consumption power of the signal to be measured generating means.

According to the phase-locked loop circuit of the second aspect, the timing of transition of the generation control signal and the timing of transition of the reference signal are constant irrespective of the timing of activation of the operation control signal.

In the phase-locked loop circuit of the second aspect, the signal to be measured is generated triggered by the generation control signal, so that the effect of the first aspect can be obtained.

According to the phase-locked loop circuit of the third aspect, as the phase difference detector outputs the phase difference voltage based on the phase difference only when the generation control signal is active, the phase difference voltage is not output in the period in which the signal to be measured is not generated.

In the phase-locked loop circuit of the third aspect, the voltage-controlled oscillator will not malfunction.

According to the phase-locked loop circuit of the fourth aspect, as the timing generating circuit counts the reference signal predetermined times and outputs the generation control signal, it is possible to output the generation control signal triggered by a pulse of the reference signal obtained first after it turns on.

In the phase-locked loop circuit of the fourth aspect, as the timing generating circuit can output the generation control signal, the effect of the second aspect can be obtained.

Accordingly, it is an object of the present invention to provide a phase-locked loop circuit with small consumption power by turning on signal to be measured generating means for generating a signal to be measured on the basis of the timing of transition of a reference signal $f_{REF}$.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 to 5 are timing charts showing the operation of the first preferred embodiment.

FIG. 11 is a circuit diagram illustrating another structure of the timing generating circuit 9 which is the second preferred embodiment of the present invention.

DESCRIPTION OF THE PREFERRED EMBODIMENTS

Figure 1:
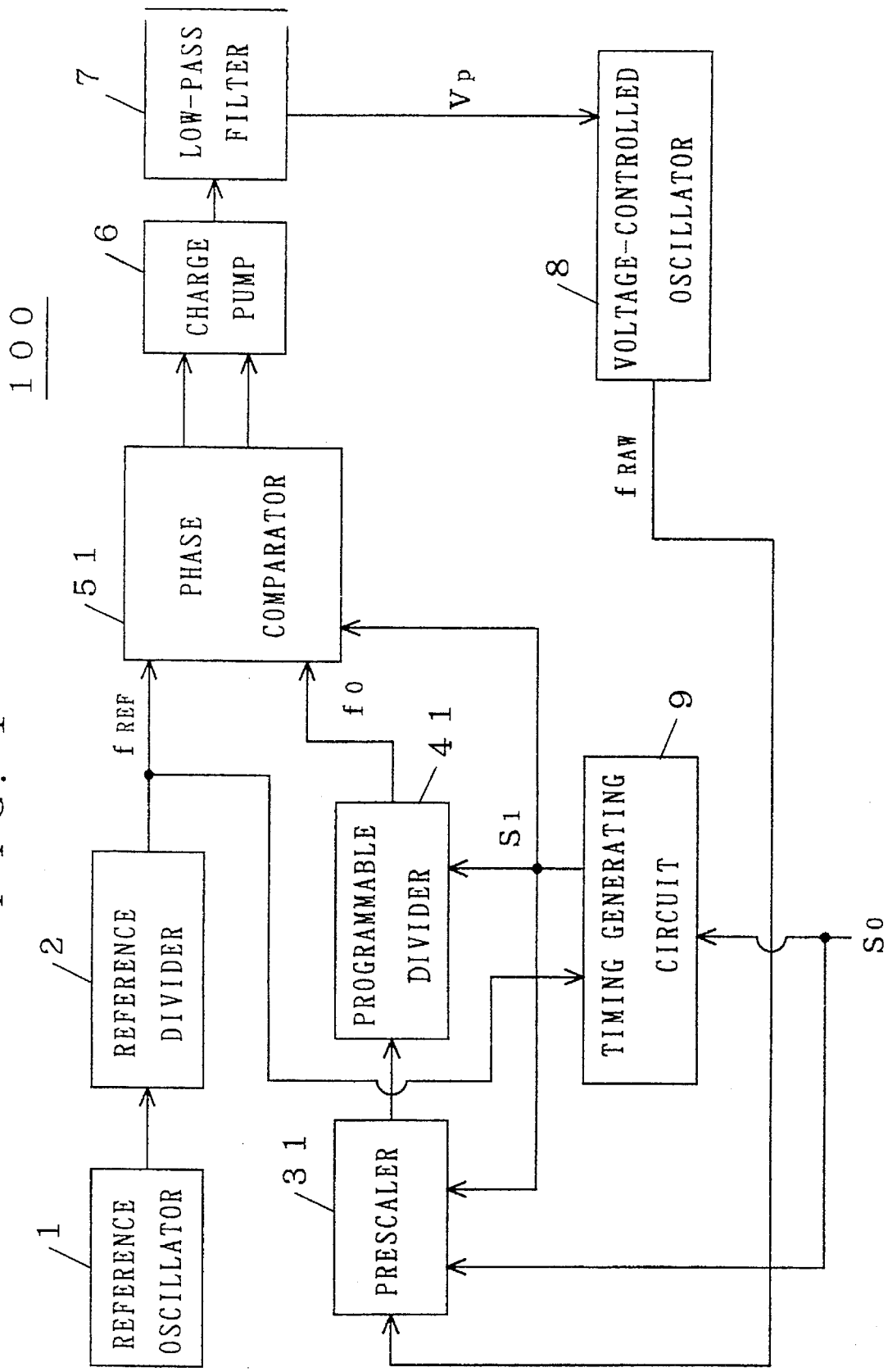
FIG. 1 is a block diagram showing the structure of a phase-locked loop circuit 100 according to the present invention.

First Preferred Embodiment:

FIG. 1 is a block diagram showing the structure of a phase-locked loop circuit 100 according to the present invention. The phase-locked loop circuit 100 has a prescaler 31, a programmable divider 41 and a phase comparator 51 substituted for the prescaler 3, the programmable divider 4 and the phase comparator 5 in the structure of the conventional phase-locked loop circuit 200, respectively, and it also has a timing generating circuit 9 in addition.

The timing generating circuit 9 receives a reference signal $f_{REF}$ and an operation control signal $S_0$ as inputs and outputs a generation control signal $S_1$. The generation control signal $S_1$ is inputted to the prescaler 31, the programmable divider 41 and the phase comparator 51.

Figure 2:
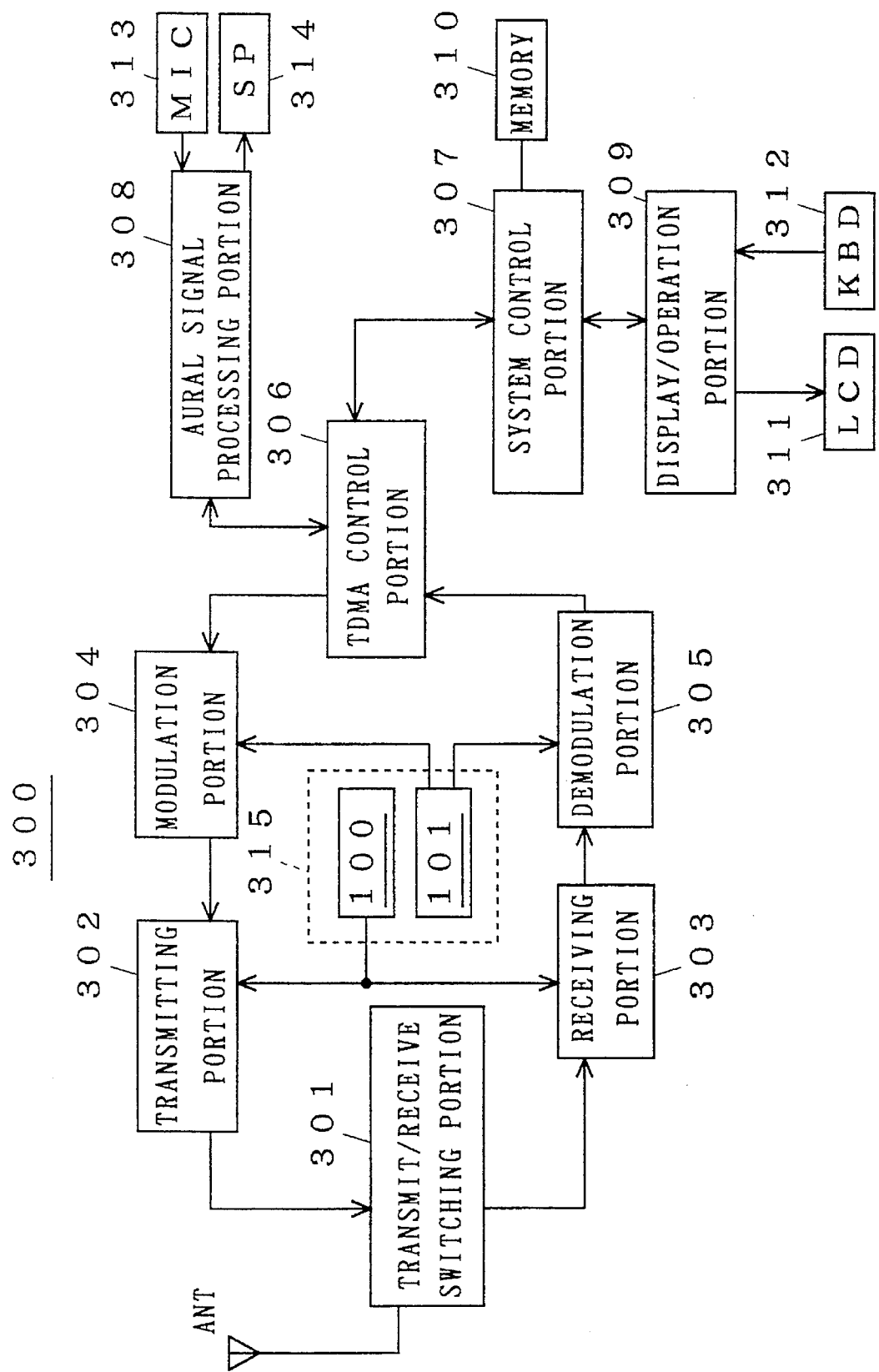
FIG. 2 is a block diagram showing the outline of the structure of a digital cordless phone 300 to which the present invention is applied.

FIG. 2 is a block diagram showing the outline of the structure of a digital cordless phone 300 in which the phase-locked loop circuit 100 is used. Such a digital cordless phone 300 is used in the PHS (Personal Handy Phone System), for example.

Switching of transmit/receive of an antenna ANT is made in a transmit/receive switching portion 301. When receiving, the radiowaves received at the antenna ANT are provided to a receiving portion 303, and when transmitting, the output of the transmitting portion 302 is provided to the antenna ANT.

The digital cordless phone 300 makes transmission/reception at about 1.9 GHz, where a first local oscillation frequency of about 1.6 GHz and a second local oscillation frequency of about 250 MHz are used in a frequency synthesizer, for example. Accordingly, a local oscillation portion 315 is provided with two phase-locked loop circuits 100 and 101. Here is shown the case where the phase-locked loop circuit 100 of the present invention provides signal having the first local oscillation frequency to the transmitting portion 302 and the receiving portion 303, and the phase-locked loop circuit 101 provides signal having the second local oscillation frequency to a modulation portion 304 and the demodulation portion 305, respectively. It is a matter of course that the present invention can be applied to the phase-locked loop circuit 101, too.

Signal demodulated in the demodulation portion 305 is subjected to predetermined processing in a TDMA (Time Division Multiple Access) control portion 306 and thus speech is obtained from a loudspeaker 314 through an aural signal processing portion 308. The speech inputted from a microphone 313 is transferred to the TDMA control portion 306 through the aural signal processing portion 308, where it is processed in a predetermined manner and then transmitted to the modulation portion 304. The output of the modulation portion 304 is amplified in the transmitting portion 302 and then transmitted through the transmit/receive switching portion 301 and the antenna ANT.

An LCD 311 for displaying telephone numbers etc. and a keyboard 312 for input of telephone numbers etc. are connected to a display/operation portion 309. Information inputted from the keyboard 312 is processed in a predetermined manner in the display/operation portion 309 and then provided to a system control portion 307. The information subjected to the predetermined processing in the display/operation portion 309 is provided to the LCD 311.

The system control portion 307 has a memory 310 connected thereto and controls the TDMA control portion 306, too.

Figure 3:
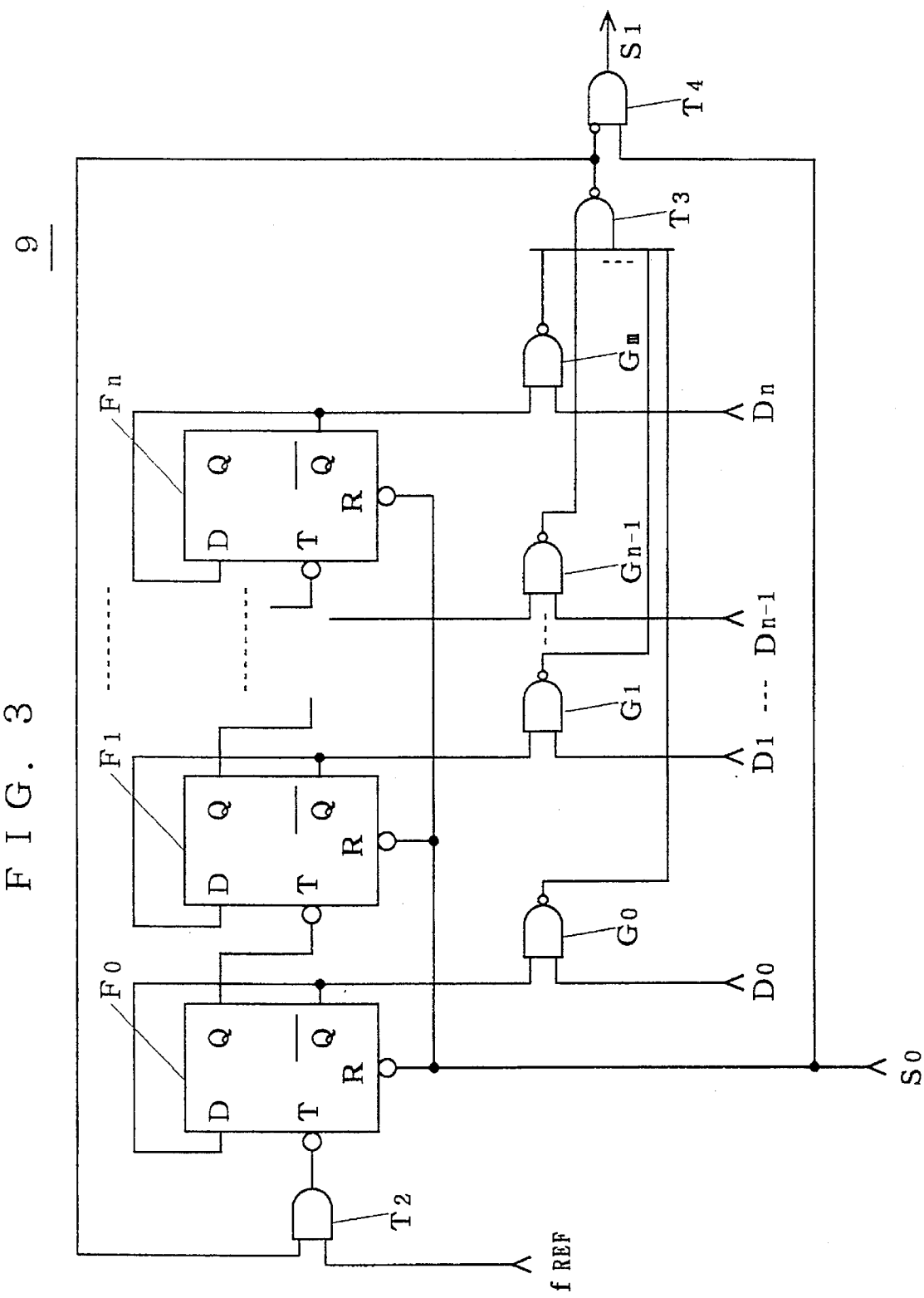
FIG. 3 is a circuit diagram showing one example of the structure of the timing generating circuit 9.

FIG. 3 is a circuit diagram showing one example of the structure of the timing generating circuit 9. The timing generating circuit 9 includes AND gates $T_2$, $T_4$, NAND gates $T_3$, $G_0$, $G_1$, ... $G_n$, D flip-flops $F_0$, $F_1$, ..., $F_n$.

The D flip-flops $F_0$, $F_1$, ..., $F_n$ are connected in series in this order. The "series" here means that a Q output of a preceding stage Fi ($1 \leq i \leq n-1$) of adjacent two D flip-flops is provided as a T input of a following stage $F_{i+1}$.

Each of the D flip-flops $F_0$, $F_1$, ..., $F_n$ provides a $\overline{Q}$ output of itself to a D input of itself. The operation control signal $S_0$ is inputted as an R input.

Each of the D flip-flops $F_0$, $F_1$, ..., $F_n$ has a function of providing the D input of itself as the Q output at a fall of the T input of itself and resetting the Q output if the R input is in an "L" state.

Each of the NAND gates $G_0$, $G_1$, ..., $G_n$ outputs inversion of a logical product of two inputs, to which the $\overline{Q}$ output of the D flip-flops $F_0$, $F_1$, ..., $F_n$ is provided as one input of each, respectively. The signals $D_0$, $D_1$, ..., $D_n$ are applied as the other inputs, respectively.

The NAND gate $T_3$ outputs an inversion of a logical product of outputs of the NAND gates $G_0$, $G_1$, ..., $G_n$ and provides it as one input of the AND gate $T_2$. The reference signal $f_{REF}$ is provided as the other input of the AND gate $T_2$, and a logical product of them is provided as the T input of the D flip-flop $F_0$.

The AND gate $T_4$ takes a logical product of an inversion of output of the NAND gate $T_3$ and the operation control signal $S_0$ to output the generation control signal $S_1$.

FIGS. 4 and 5 are timing charts showing the relation among the reference signal $f_{REF}$, the operation control signal $S_0$, the generation control signal $S_1$ and the signal to be measured $f_0$. When the operation control signal $S_0$ is "L", the AND gate $T_4$ closes and the generation control signal $S_1$ is always "L".

When the operation control signal $S_0$ goes "H", however, the D flip-flops $F_0$, $F_1$, ..., $F_n$ start counting falls of the reference signal $f_{REF}$. Then, until the reference signal $f_{REF}$ is counted K times (K: an integer) specified by the signals $D_0$, $D_1$, ..., $D_n$, the NAND gate $T_3$ outputs "H", and the AND gate $T_2$ is open, so that the reference signal $f_{REF}$ is continuously counted.

When the reference signal $f_{REF}$ is counted K times, the NAND gate $T_3$ outputs "L" and the AND gate $T_2$ closes, and then the reference signal $f_{REF}$ is not counted any more. At this time, as long as the operation control signal $S_0$ is "H", the generation control signal $S_1$ remains "H". (FIG. 4) When the operation control signal $S_0$ goes "L", however, the AND gate $T_4$ closes and then the generation control signal $S_1$ also goes "L" (FIG. 5).

As will be described later, as the prescaler 31 and the programmable divider 41 function only when the generation control signal $S_1$ is "H", consumption power thereof can be suppressed. Further, the generation control signal $S_1$ goes "H" when the operation control signal $S_0$ attains "H" and the reference signal $f_{REF}$ is counted predetermined times (k times, for example), and the raw signal $f_{RAW}$ is divided after the generation control signal $S_1$ goes "H" to generate the signal to be measured $f_0$, therefore the phase difference δ between the reference signal $f_{REF}$ and the signal to be measured $f_0$ at the start is constant irrespective of the timing of the operation control signal $S_0$ going to "H". Accordingly, it is not necessary to set the timing at which the operation control signal $S_0$ goes "H" considerably earlier prior to the period required in the time-division telegraphy, and therefore unnecessary power consumption can be suppressed.

Now, the timing generating circuit 9 counts the reference signal $f_{REF}$ times to ensure a time for the prescaler 31 to be stabilized. The time can be set appropriately by the signals $D_0$, $D_1$, ..., $D_n$.

Figure 6:
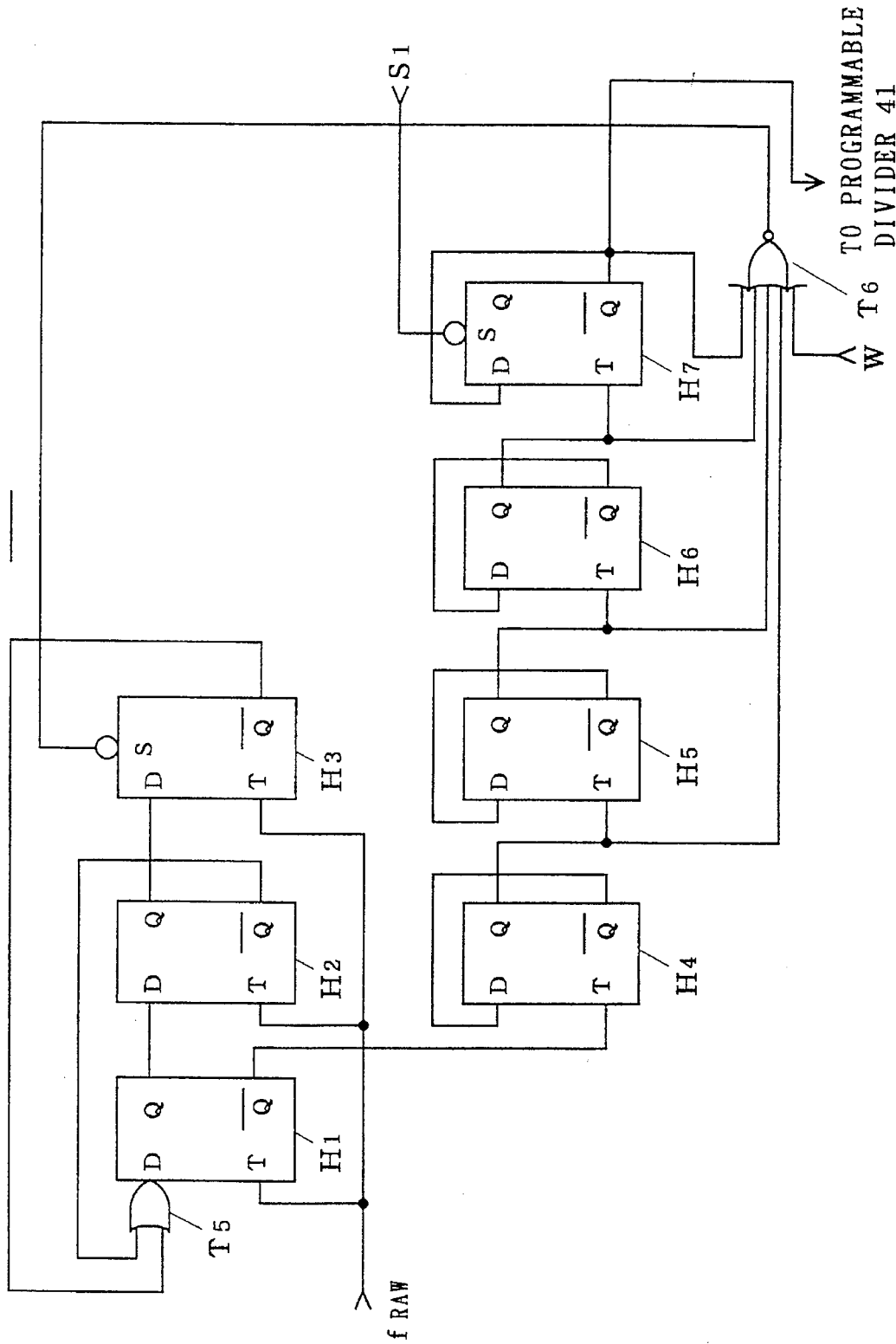
FIG. 6 is a circuit diagram illustrating the structure of the prescaler 31 as an example.

FIG. 6 is a circuit diagram illustrating the structure of the prescaler 31 by example. The prescaler 31 is designed using circuitry which consumes a large amount of power but which can process high frequencies, such as the ECL circuitry. This is because of the purpose of dividing the raw signal $f_{RAW}$ having a high frequency. The prescaler 31 includes an OR gate $T_5$, a NOR gate $T_6$, and D flip-flops $H_1$–$H_7$.

The $f_{RAW}$ is provided as the T inputs of the D flip-flops $H_1$–$H_3$, and the $\overline{Q}$ output of the D flip-flop $H_1$, and the Q outputs of the D flip-flops $H_4$, $H_5$, $H_6$ are provided as T inputs of the D flip-flops $H_4$, $H_5$, $H_6$, respectively.

The D flip-flops $H_2$, $H_3$ are provided with the Q outputs of the D flip-flops $H_1$, $H_2$ as the D inputs, and the D flip-flops $H_4$–$H_7$ are provided with the $\overline{Q}$ outputs of themselves as the D inputs, respectively. The OR gate $T_5$ takes a logical sum of the $\overline{Q}$ outputs of the D flip-flops $H_2$, $H_3$, which is provided as the D input of the D flip-flop $H_1$.

The NOR gate $T_6$ outputs an inversion of a logical sum of the Q outputs of the D flip-flops $H_4$–$H_7$ and the switching signal W and provides it to the set end S of the D flip-flop $H_3$. The generation control signal $S_1$ is provided to the set end S of the D flip-flop $H_7$. The D flip-flops $H_3$ and $H_7$ are set when the signal applied to the set ends S of themselves are in an "L" state. That is to say, the $\overline{Q}$ output is reset.

With such circuit configuration, the prescaler 31 performs dividing of 1/64 or 1/65 to the raw signal $f_{RAW}$ according to the logic value of the switching signal W, and outputs the result to the programmable divider 41. Furthermore, such a function is performed only when the generation control signal $S_1$ is "H".

Figure 7:
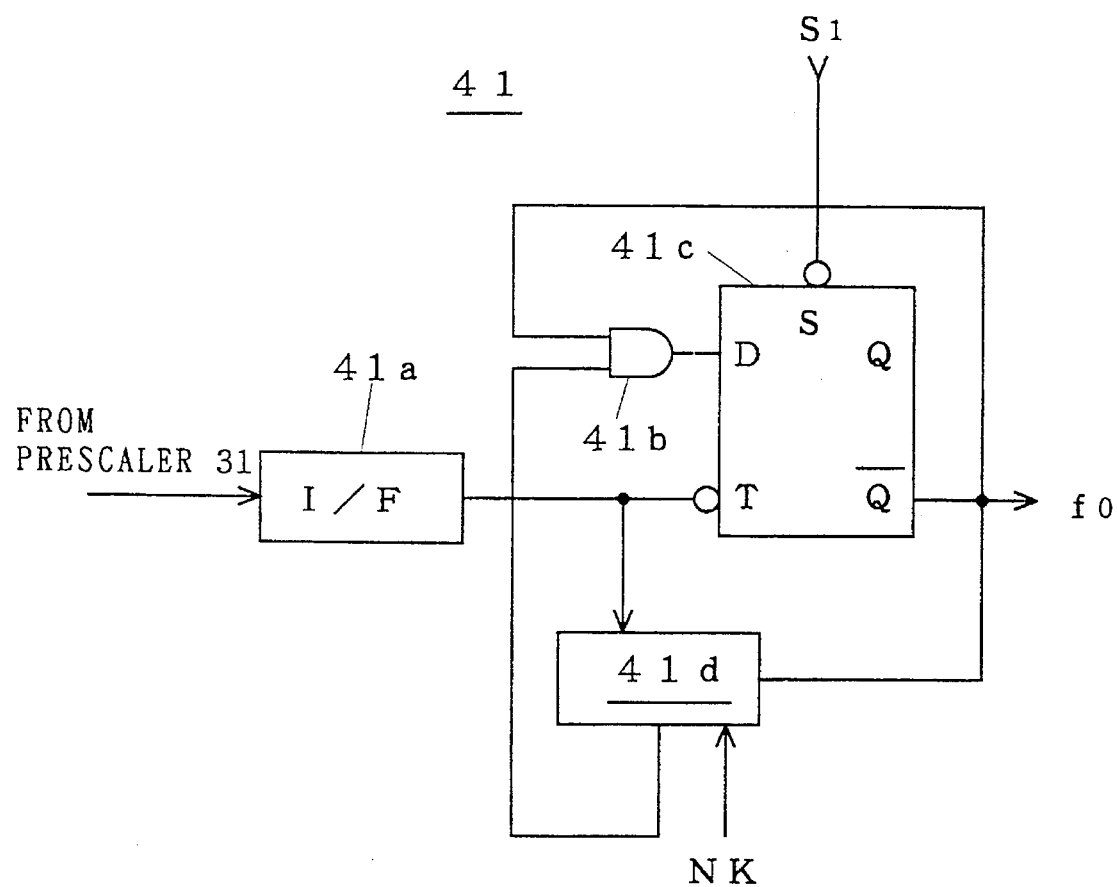
FIG. 7 is a circuit diagram illustrating the structure of the programmable divider 41 as an example.

FIG. 7 is a circuit diagram illustrating the structure of the programmable divider 41 by example. The programmable divider 41 includes an interface 41a, an AND gate 41b, a D flip-flop 41c and a programmable counter 41d.

The interface 41a converts the level of the output obtained from the prescaler 31 to the CMOS level and provides it as the T input of the D flip-flop 41c and the input of the programmable counter 41d. The AND gate 41b provides a logical product of the $\overline{Q}$ output of the D flip-flop 41c and the output of the programmable counter 41d as the D input of the D flip-flop 41c.

The AND gate 41b, the D flip-flop 41c and the programmable counter 41d can be configured by using CMOS circuitry to decrease the consumption power. They can be configured by using the CMOS circuitry because they divide the output of the prescaler 31 but they do not have to process signal with high frequency, such as the raw signal $f_{RAW}$.

The generation control signal $S_1$ is provided to the set end S of the D flip-flop 41c. Accordingly, the generation control signal $S_1$ goes "L" to set the Q output thereof. Therefore, the $\overline{Q}$ output thereof is reset (goes "L"). This $\overline{Q}$ output becomes the signal to be measured $f_0$.

The programmable counter 41d further divides the reference signal $f_{REF}$, which has been divided by the prescaler 31, into 1/100 through 1/1000, for example. That is to say, it outputs "H" only when the reference signal $f_{REF}$ is counted a predetermined number of times and provides it to the AND gate 41b.

Now, the operation will be described referring to the timing chart shown in FIG. 4. First, the $\overline{Q}$ output of the D flip-flop 41c is reset when the generation control signal $S_1$ is "L" and the signal to be measured $f_0$ remains "L". Next, when () the generation control signal $S_1$ goes "H", the signal from the prescaler 31 changes from this time as has been described relating to the operation of the prescaler 31. The reset of the $\overline{Q}$ output of the D flip-flop 41c is cancelled. However, the AND gate 41b is closed until the programmable counter 41d counts the signal from the prescaler 31 predetermined times, and the D input of the D flip-flop 41c is "L". Accordingly, the signal to be measured $f_0$ rises to "H". This rise of the signal to be measured $f_0$ is delayed from the rise of the generation control signal $S_1$ due to the delay of the D flip-flop 41c etc.

Then, when the programmable counter 41d has counted the signal from the prescaler 31 predetermined times, the AND gate 41b opens and the $\overline{Q}$ output which was "H" is provided as the D input and the signal to be measured $f_0$ falls to "L". In the time δ from the rise of the generation control signal $S_1$ to the fall of the signal to be measured $f_0$ to "L", the signal from the prescaler 31 is counted a predetermined number of times, e.g. 100 times or 1000 times.

Further, when the signal from the prescaler 31 falls, the programmable counter 41d outputs "L" and the AND gate 41b closes, so the D input is "L" and the signal to be measured $f_0$ becomes "H". Accordingly, the pulse width of the signal to be measured $f_0$ is equal to one period of the signal from the prescaler 31.

As described above, even when the programmable counter 41d is counting the signal from the prescaler 31, the Q output of the D flip-flop 41c is set when the generation control signal $S_1$ attains "L", so that the signal to be measured $f_0$ which is the $\overline{Q}$ output makes a transition to "L" (FIG. 5).

The signal to be measured $f_0$ is provided also to the programmable counter 41d to provide a timing for latching the program signal NK applied to the programmable counter 41d. This program signal NK is a signal for defining the dividing ratio of the programmable counter 41d, which is changed when the channel of the digital cordless phone 300 is changed.

Figure 8:
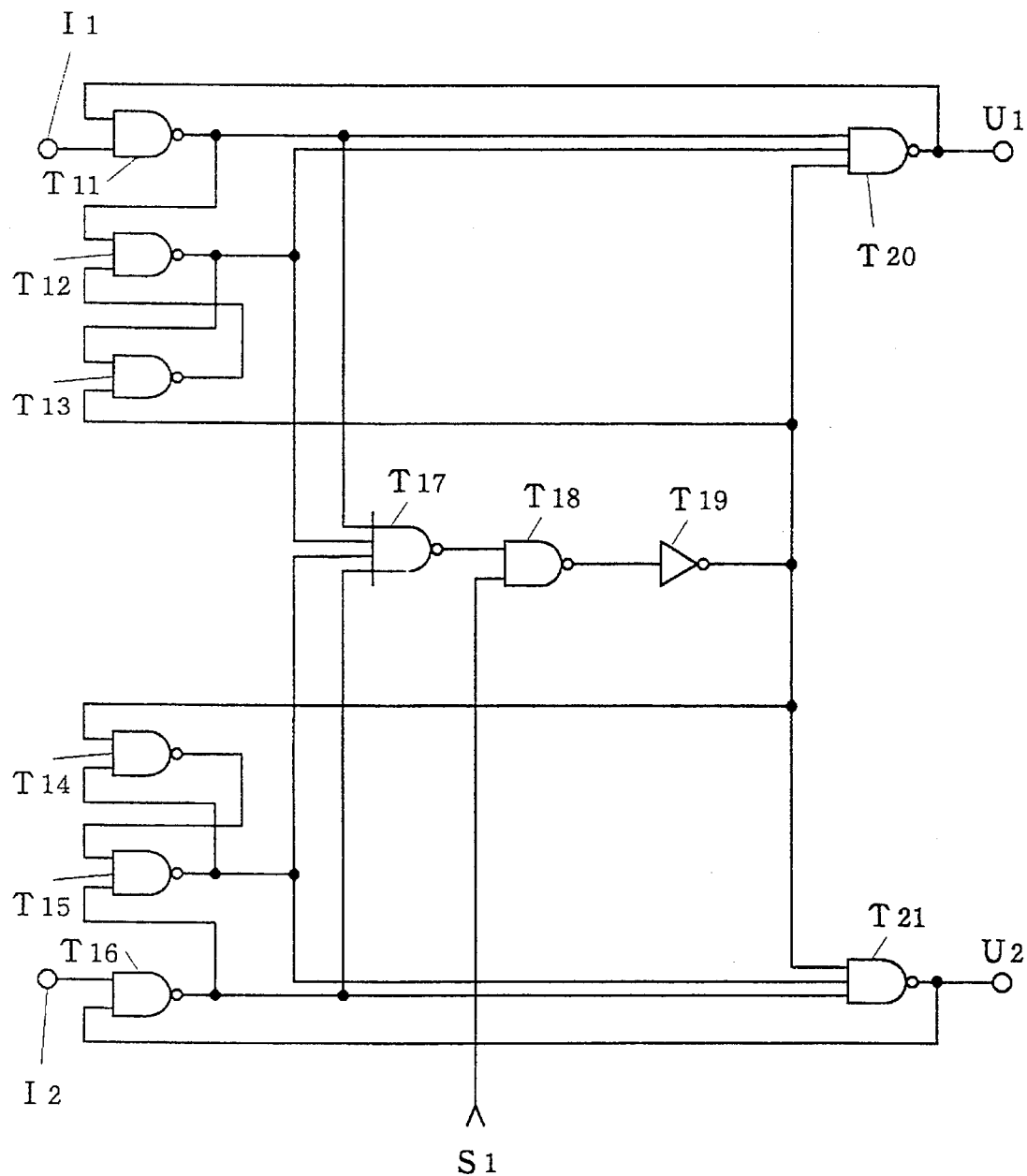
FIG. 8 is a circuit diagram illustrating the structure of the phase comparator 51.

FIG. 8 is a circuit diagram illustrating the structure of the phase comparator 51 by example. The phase comparator 51 includes 2-input NAND gates $T_{11}$–$T_{16}$, $T_{18}$, 3-input NAND gates $T_{20}$, $T_{21}$, a 4-input NAND gate $T_{17}$, and an inverter $T_{19}$.

The NAND gate $T_{11}$ has its one input end connected to the input terminal $I_1$, and the other input end connected to the output terminal $U_1$, respectively. The NAND gate $T_{11}$ also has its output end connected to one input end of the NAND gate $T_{12}$, the first input end of the NAND gate $T_{20}$ and the first input end of the NAND gate $T_{17}$ in common.

The NAND gate $T_{12}$ has its output end connected to one input end of the NAND gate $T_{13}$, the second input end of the NAND gate $T_{20}$ and the second input end of the NAND gate $T_{17}$ in common. The NAND gate $T_{13}$ has its output end connected to the other input end of the NAND gate $T_{12}$.

The NAND gate $T_{16}$ has its one input end connected to the input terminal $I_2$ and the other input end connected to the output terminal $U_2$, respectively. The NAND gate $T_{16}$ has its output end connected to one input end of the NAND gate $T_{15}$, the first input end of the NAND gate $T_{21}$ and the third input end of the NAND gate $T_{17}$ in common.

The NAND gate $T_{15}$ has its output end connected to one input end of the NAND gate $T_{14}$, the second input end of the NAND gate $T_{21}$ and the fourth input end of the NAND gate $T_{17}$ in common. The NAND gate $T_{14}$ has its output end connected to the other input end of the NAND gate $T_{15}$.

The NAND gate $T_{18}$ has its one input end connected to the output end of the NAND gate $T_{17}$, and the other input end supplied with the generation control signal $S_1$. The NAND gate $T_{18}$ has its output end connected to the input end of the inverter $T_{19}$, and the inverter $T_{19}$ has its output end connected to the third input end of the NAND gate $T_{20}$, the third input end of the NAND gate $T_{21}$, the other input end of the NAND gate $T_{14}$ and the other input end of the NAND gate $T_{13}$.

First, consider a case where the generation control signal $S_1$ is "H" and a logic value the same as the output of the NAND gate $T_{17}$ is applied to the other input ends of the NAND gates $T_{13}$, $T_{14}$ through the inverter $T_{19}$.

The reference signal $f_{REF}$ is inputted to the input terminal $I_1$ and the signal to be measured $f_0$ is inputted to the $I_2$, respectively. Consider first that both of the reference signal $f_{REF}$ and the signal to be measured $f_0$ are "L". In this case, both the NAND gates $T_{11}$, $T_{16}$ necessarily output "H". Even if the outputs of the NAND gates $T_{12}$, $T_{15}$ are "H", the output of the NAND gate $T_{17}$ goes "L" and the outputs of the NAND gates $T_{13}$, $T_{14}$ go "H", so the outputs of the NAND gates $T_{12}$, $T_{15}$ go "L" after all. Accordingly, the outputs of the NAND gates $T_{20}$, $T_{21}$ both always output "H" when both the reference signal $f_{REF}$ and the signal to be measured $f_0$ are "L". After that, when the reference signal $f_{REF}$ goes "H", the output of the NAND gate $T_{20}$ goes "L" and the NAND gate $T_{11}$ outputs "L". When the signal to be measured $f_0$ goes "H", the output of the NAND gate $T_{21}$ goes "L" and the NAND gate $T_{16}$ outputs "L". Accordingly, the outputs of the NAND gates $T_{20}$, $T_{21}$ remain outputting "H".

Figure 9:
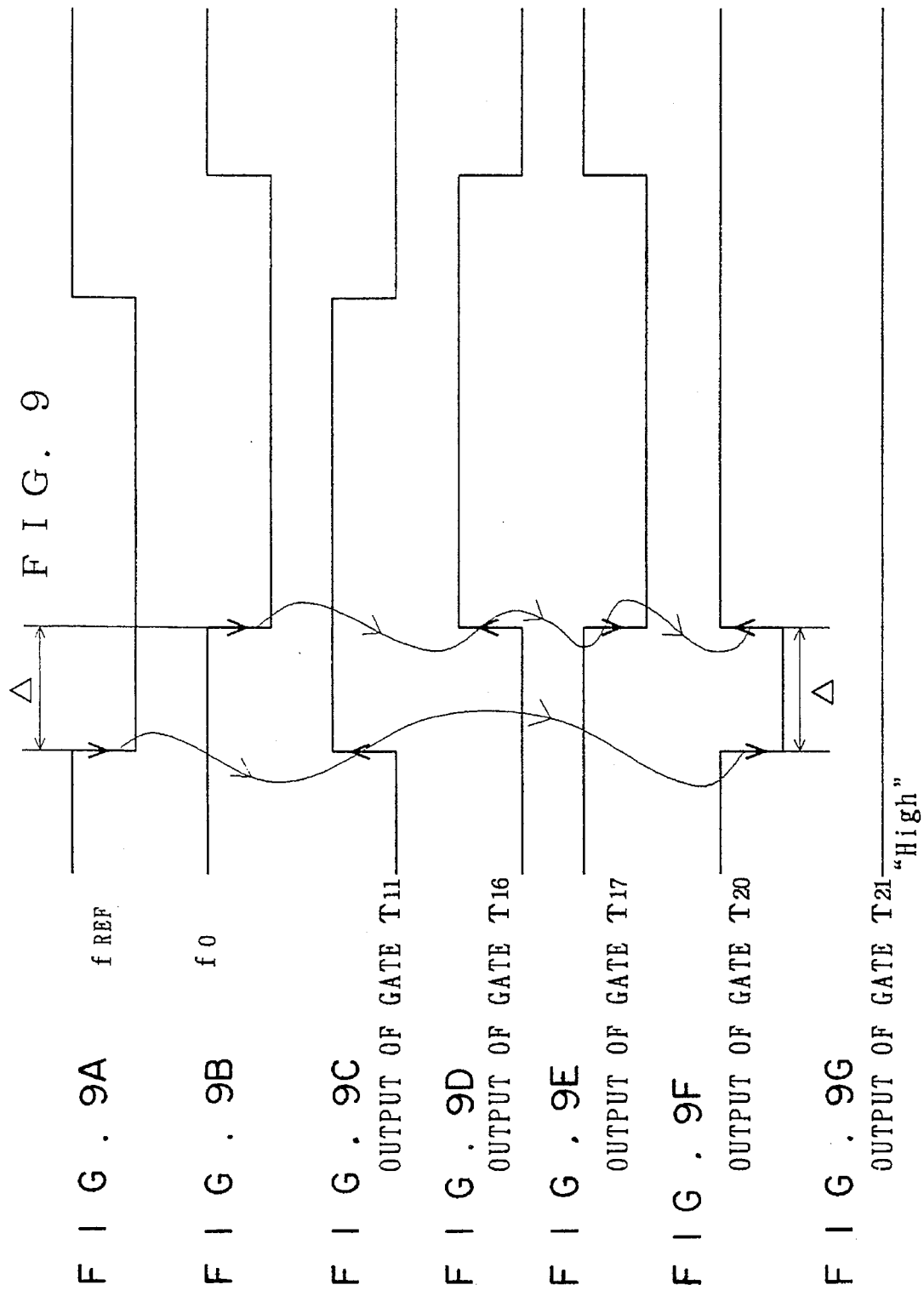
FIG. 9 is a timing chart showing the operation of the phase comparator 51.

FIG. 9 is a timing chart showing the operation of the phase comparator 51. Suppose that, subsequently to the operations described above, the reference signal $f_{REF}$ first falls and then the signal to be measured $f_0$ falls being delayed by a phase difference Δ. In response to the fall of the reference signal $f_{REF}$, the output of the NAND gate $T_{11}$ makes a transition to "H", but the output of the NAND gate $T_{16}$ remains "L"

because the signal to be measured $f_0$ remains "H". Hence, the output of the NAND gate $T_{17}$ does not change from "H", so the output of the NAND gate $T_{20}$ makes a transition to "L". The output of the NAND gate $T_{21}$ remains "H".

Next, when the signal to be measured $f_0$ falls, then the output of the NAND gate $T_{16}$ makes a transition to "H", all of the four inputs of the NAND gate $T_{17}$ go "H" and its output makes a transition to "L". As a result, the output of the NAND gate $T_{20}$ makes a transition again from "L" to "H", and outputs a pulse signal with a width equal to the phase difference Δ. In response to the transition of the output of the NAND gate $T_{16}$ to "H", the output of the NAND gate $T_{21}$ tries to make a transition to "L", but remains almost "H" because the output of the NAND gate $T_{17}$ immediately makes a transition to "L", even though it may make a transition to "L" only for an instant.

That is to say, at the timing of fall of the reference signal $f_{REF}$, through the path directly entering the NAND gate $T_{20}$ from the NAND gate $T_{12}$, the output of the NAND gate $T_{20}$ is made to make a transition from "H" to "L". Then, at the timing of fall of the signal to be measured $f_0$, through the path via the NAND gate $T_{17}$, the output of the NAND gate $T_{20}$ is made to make a transition from "L" to "H". After that, the output of the NAND gate $T_{20}$ remains "H" even when the reference signal $f_{REF}$ and the signal to be measured $f_0$ make a transition from "L" to "H" as described above.

On the other hand, when the signal to be measured $f_0$ falls first and then the reference signal $f_{REF}$ falls, the value appearing at the output terminal $U_1$ remains "H" and the value appearing at the output terminal $U_2$ shows a waveform of a pulse.

Accordingly, the phase comparator 51 functions as a usual phase comparator when the generation control signal $S_1$ is "H". However, as "L" is always applied to the fourth input ends of the NAND gates $T_{20}$, $T_{21}$ when the generation control signal $S_1$ is "L", the value "H" always appears at the output terminals $U_1$, $U_2$.

Figure 10:
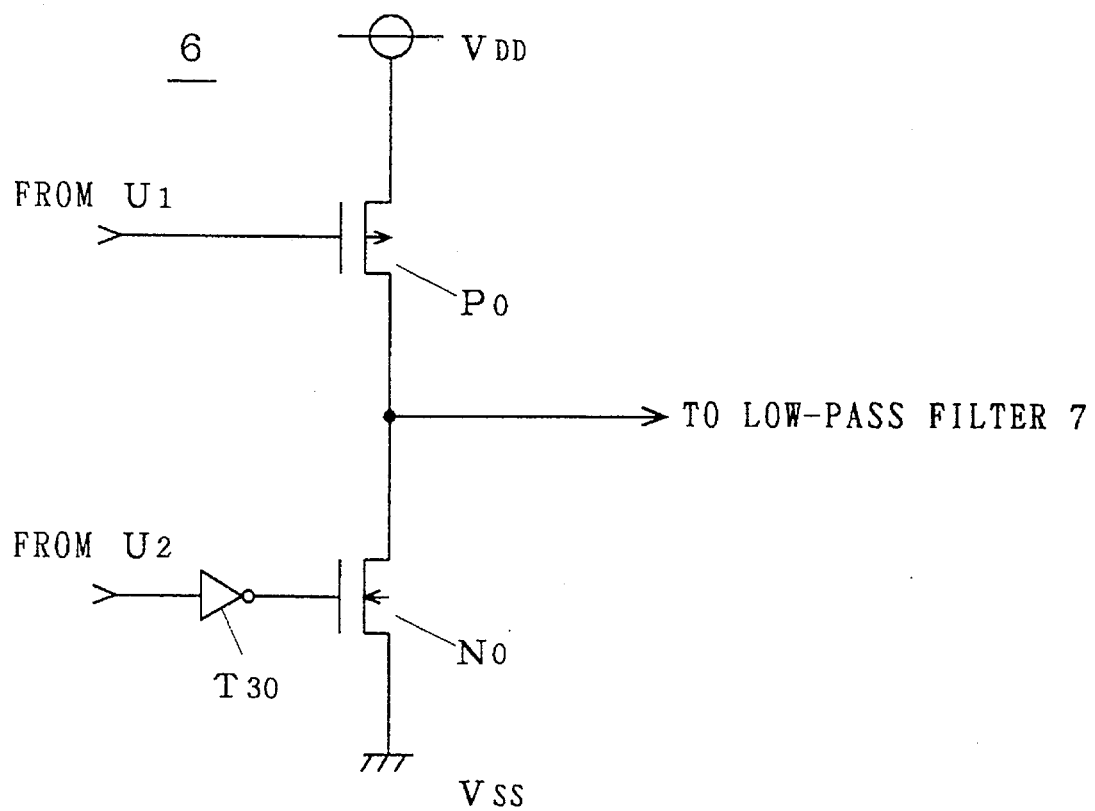
FIG. 10 is a circuit diagram illustrating the structure of the charge pump 6.
Figure 12A:
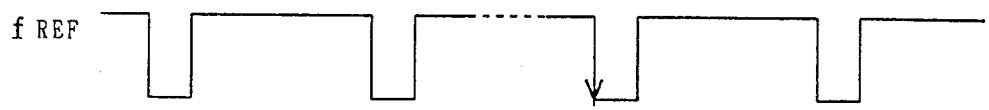
FIG. 12 is a timing chart showing the operation of the second preferred embodiment of the present invention.
Figure 12B:
Figure 12C:
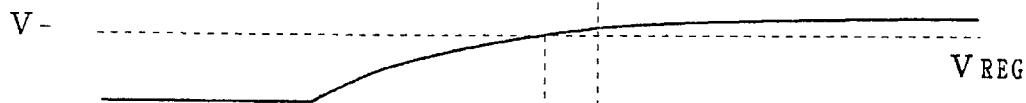
Figure 12D:
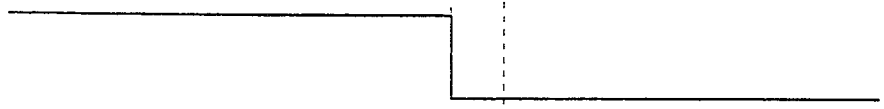
Figure 12E:
Figure 12F:
Figure 12G:
Figure 13:
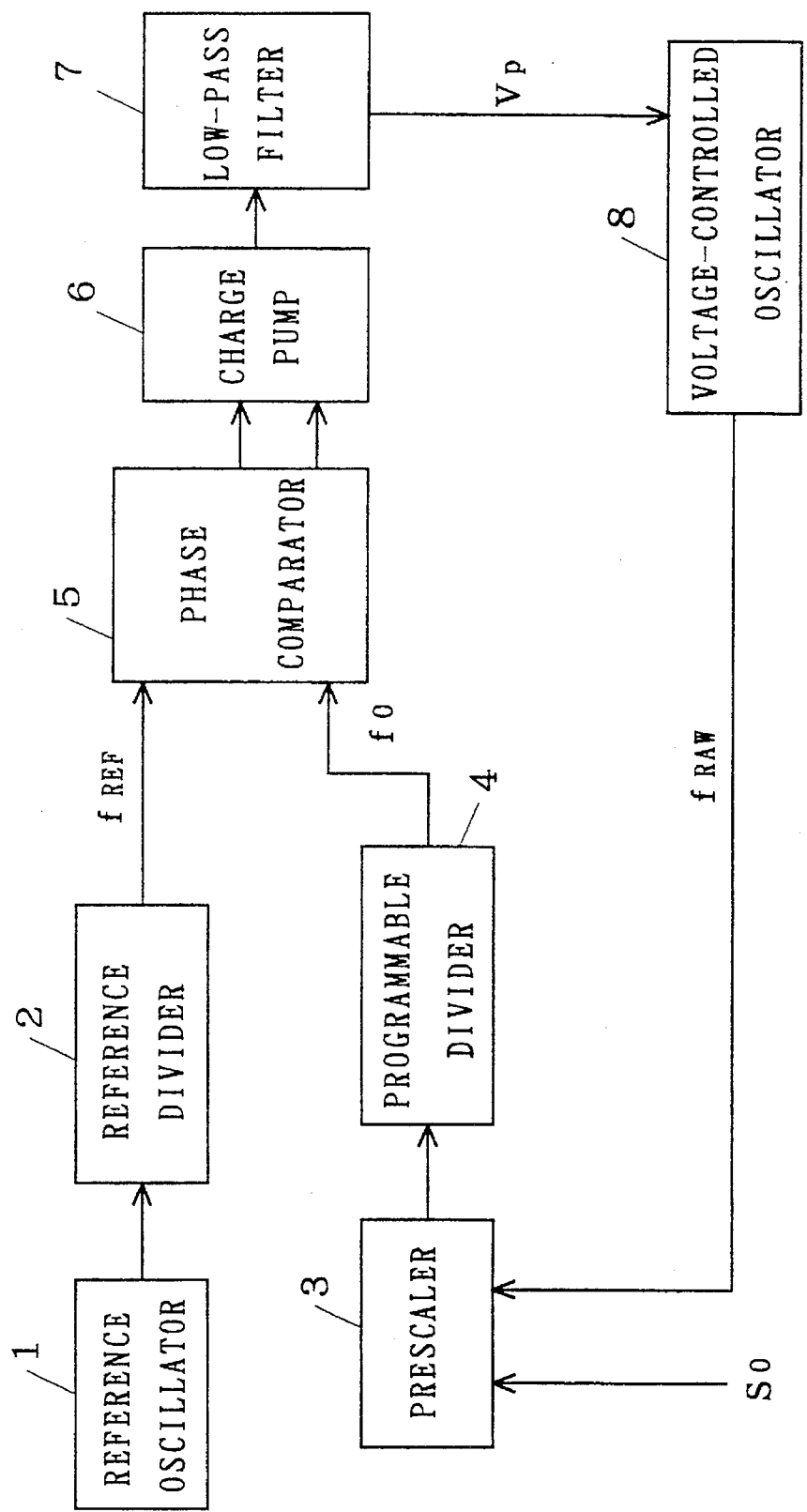
FIG. 13 is a block diagram showing the structure of the conventional art.
Figure 14A:
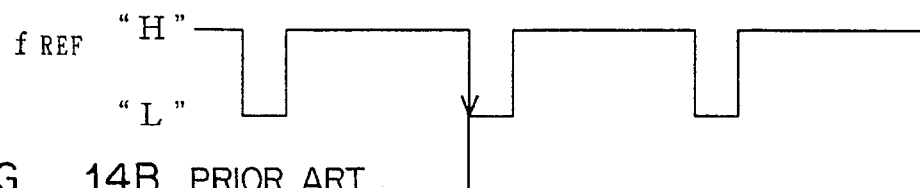
FIG. 14 is a timing chart showing the operation of the conventional art.
Figure 14B:
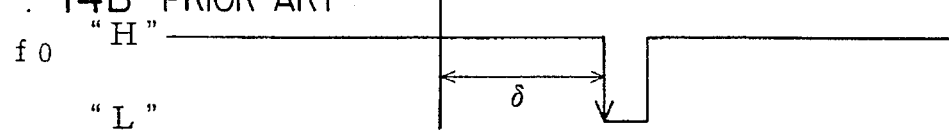
Figure 14C:
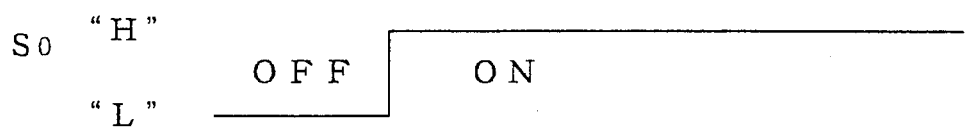

FIG. 10 is a circuit diagram illustrating the structure of the charge pump 6 by example. The charge pump 6 has a power-supply $V_{DD}$ corresponding to "H", a power-supply $V_{SS}$ corresponding to "L", a PMOS transistor $P_0$ having its source connected to the power-supply $V_{DD}$, its gate connected to the output terminal $U_1$ of the phase comparator 51, and a drain, an inverter $T_{30}$ having its input end connected to the output terminal $U_2$ of the phase comparator 51 and an output, and an NMOS transistor $N_0$ having its source connected to the power-supply $V_{SS}$ corresponding to "L", its gate connected to the output end of the inverter $T_{30}$, and its drain connected to the drain of the PMOS transistor $P_0$.

If the generation control signal $S_1$ is "H" in the phase comparator 51, in the charge pump 6, charge is delivered from the power-supply $V_{DD}$ or the power-supply $V_{SS}$ to the low-pass filter 7 corresponding to the pulse of "L" appearing at the output terminals $U_1$, $U_2$, respectively. As a result, a phase difference voltage $V_P$ can be obtained on the basis of the phase difference between the reference signal $f_{REF}$ and the signal to be measured $f_0$ and control can be made to make the frequencies of the two coincided.

However, if the generation control signal $S_1$ is always "L", the output terminals $U_1$, $U_2$ are always at "H", and the charge is not delivered as described above.

That is, if the generation control signal $S_1$ attains "L" in the phase comparator 51, the phase comparator 51 does not perform the function of comparing phases, and furthermore, the operation of comparing the phases is reset.

As described above, according to the first preferred embodiment, the timing circuit 9 is provided and the generation control signal $S_1$ is obtained on the basis of the reference signal $f_{REF}$, with which functions of the prescaler 31, the programmable divider 41 and the phase comparator 51 are turned on/off, therefore the phase difference (time difference) δ between the signal to be measured $f_0$ and the reference signal $f_{REF}$ can be constant. Accordingly, it is not necessary to turn on the operation control signal $S_0$ for unnecessarily long prior to the period required in the time-division telegraphy. Especially, it is effective in suppressing power consumption since the function of the prescaler 31 with large power consumption does not have to be ON unnecessarily long.

Second Preferred Embodiment

FIG. 11 is a circuit diagram illustrating another structure of the timing generating circuit 9 by example. A resistor R having its one end connected to a power-supply $V_{CC}$ which provides high potential has the other end connected to a drain of an NMOS transistor $N_1$. An output end of an inverter $A_0$ is connected to () the gate of the NMOS transistor $N_1$. The source of the NMOS transistor $N_1$ is grounded. The operation control signal $S_0$ is applied to the input end of the inverter $A_0$, and the NMOS transistor $N_1$ lowers the other end of the resistor R almost to the ground potential while the operation control signal $S_0$ is inactive.

One ends of capacitors $C_0$–$C_n$ are also connected to the other end of the resistor R in common and the other ends of the capacitors $C_0$–$C_n$ are connected to drains of NMOS transistors $N_2$–$N_{n+2}$, respectively. The signals $D_0$–$D_n$ are applied to the gates of the NMOS transistors $N_2$–$N_{n+2}$, respectively, and the sources thereof are all grounded in common.

The other end of the resistor R is further connected to a negative input end of a comparator $A_1$. A reference potential $V_{REG}$ ($0 \leq V_{REG} \leq V_{CC}$) is applied to the positive input end of the comparator $A_1$, where a value corresponding to logic "L" is outputted when the potential V_ at the other end of the resistor R exceeds the reference potential $V_{REG}$.

The output of the comparator $A_1$ is applied to a D input end of a D flip-flop $A_2$. The reference signal $f_{REF}$ is applied to the T input end of the D flip-flop $A_2$, at whose fall an inversion of the signal applied to the D input end is outputted as a $\overline{Q}$ output.

An AND gate $A_3$ takes a logical product of the $\overline{Q}$ output of the D flip-flop $A_2$ and the operation control signal $S_0$ and outputs it as the generation control signal $S_1$.

FIG. 12 is a timing chart showing the operation of the timing generating circuit 9 shown in FIG. 11. Signals $D_0$–$D_n$ determine through which of the capacitors $C_0$–$C_n$ the resistance R is grounded. If the combined capacitance of the capacitor specified by the signals $D_0$–$D_n$ is represented as $C_t$, the operation control signal $S_0$ is activated to turn off the NMOS transistor $N_1$ and the potential V_ at the other end of the resistor R rises with a time constant $RC_t$ (note that the resistance value of the resistor R is also represented by R). Then, at the time when it exceeds the reference potential $V_{REG}$, the output of the comparator $A_1$ falls. As the potential V_ still continues rising after that, the output of the comparator $A_1$ remains "L".

When the reference signal $f_{REF}$ falls in such a situation, the $\overline{Q}$ output of the D flip-flop $A_2$ rises. Then, since the operation control signal $S_0$ remains active, the output of the AND gate $A_3$, i.e., the generation control signal $S_1$ goes "H".

After that, the period required by the time-division telegraphy has passed and the operation control signal $S_0$ goes "L", then the AND gate $A_3$ closes and the generation control signal $S_1$ goes "L". Then, the NMOS transistor $N_1$ causes the potential V_ to be almost the ground potential, and the operation of the timing generating circuit 9 is reset.

As described above, while only the period determined by the signals $D_0$–$D_n$ from when the operation control signal $S_0$ is activated is ensured for stabilization of the prescaler, the generation control signal $S_1$ is activated triggered by the transition of the reference signal $f_{REF}$ in the second preferred embodiment. Accordingly, the same effects as those in the first preferred embodiment can be produced.

While the invention has been described in detail, the foregoing description is in all aspects illustrative and not restrictive. It is understood that numerous other modifications and variations can be devised without departing from the scope of the invention.

I claim:

1. A phase-locked loop circuit, comprising:

(a) raw signal generating means receiving a reference signal and a signal to be measured as inputs for detecting a phase difference of said signal to be measured with respect to said reference signal and generating a raw signal having a frequency based on said phase difference; and (b) signal to be measured generating means receiving an operation control signal and said reference signal and turned on/off by said operation control signal for generating said signal to be measured from said raw signal triggered by a pulse of said reference signal obtained first after turned on.

2. The phase-locked loop circuit according to claim 1, wherein said signal to be measured generating means comprises, (b-1) a timing generating circuit receiving said operation control signal and said reference signal for outputting a generation control signal triggered by a pulse of said reference signal obtained first after a predetermined period passes after said operation control signal is activated, and (b-2) a divider receiving said generation control signal for dividing said raw signal to generate said signal to be measured.

3. The phase-locked loop circuit according to claim 2, wherein said divider comprises, (b-2-1) a prescaler for dividing said raw signal, and (b-2-2) a programmable divider for dividing an output of said prescaler.

4. The phase-locked loop circuit according to claim 3, wherein said prescaler comprises, (b-2-1-1) at least one first D flip-flop receiving a signal which makes a transition on the basis of a transition of said raw signal as a T input, and providing a $\overline{Q}$ output of itself as a D input of itself and a Q output of itself as a T input to a next stage, and (b-2-1-2) a second D flip-flop receiving said Q output of a final stage of said first D flip-flop as a T input, providing a $\overline{Q}$ output of itself as a D input of itself and as an output of said prescaler, and resetting said $\overline{Q}$ output of itself when said generation control signal is inactive.

5. The phase-locked loop circuit according to claim 4, wherein said prescaler is comprised of an ECL circuit.

6. The phase-locked loop circuit according to claim 3, wherein said programmable divider comprises, (b-2-2-1) a counter for counting output of said prescaler a predetermined number of times, (b-2-2-2) an AND gate having a first input end receiving an output of said counter, a second input end and an output end, (b-2-2-3) a D flip-flop having a $\overline{Q}$ output end connected to said second input end of said AND gate, a D input end connected to said output end of said AND gate, and a T input end supplied with output of said prescaler, for resetting a value provided to said $\overline{Q}$ output end of itself when said generation control signal is inactive, and said value provided to said $\overline{Q}$ output of said D flip-flop corresponding to said signal to be measured.

7. The phase-locked loop circuit according to claim 6, wherein said counter receives said signal to be measured as an input and latches a number-of-times control signal on the basis of a timing of a transition of said signal to be measured and determines said predetermined number of times on the basis of said number-of-times control signal.

8. The phase-locked loop circuit according to claim 6, wherein said programmable divider is comprised of a CMOS circuit.

9. The phase-locked loop circuit according to claim 2, wherein said timing generating circuit comprises, (b-1-1) first and second potential points, (b-1-2) a resistor having one end connected to said first potential point and the other end, (b-1-3) a first MOS transistor of a first conductivity type having a drain connected to said other end of said resistor, a gate supplied with an inversion of said operation control signal and a source connected to said second potential point, (b-1-4) first through n-th capacitor(s) ($1 \leq n$) each having one end connected to said other end of said resistor, and the other end, (b-1-5) a (k+1)-th MOS transistor of the first conductivity type provided corresponding to said k-th capacitor ($1 \leq k \leq n$, k is an integer) and having a gate supplied with a k-th logic, a drain connected to said other end of said k-th capacitor and a source connected to a source of said first MOS transistor, (b-1-6) a comparator having a first input end connected to said other end of said resistor and a second input end supplied with a reference potential for comparing a potential supplied to said first input end and a potential supplied to said second input end to output a result thereof, (b-1-7) a logic element for outputting an inversion of an output of said comparator with a transition of said reference signal, and (b-1-8) an AND gate for taking a logical product of an output of said logic element and said operation control signal to output it as said generation control signal.

10. The phase-locked loop circuit according to claim 2, wherein said raw signal generating means comprises, (a-1) a phase difference detector for outputting a phase difference voltage based on said phase difference only when said generation control signal is active, and (a-2) a voltage-controlled oscillator for generating said raw signal on the basis of said phase difference voltage.

11. The phase-locked loop circuit according to claim 10, wherein said phase difference detector comprises, (a-1-1) a phase comparator for outputting a first phase difference signal having a width equal to said phase difference when said reference signal has a phase leading said signal to be measured, and outputting a second phase difference signal having a width equal to said phase difference when said reference signal has a phase delayed from said signal to be measured, respectively, (a-1-2) a charge pump receiving said first phase difference signal and second phase difference signal for outputting charges complementary to each other, respectively, and (a-1-3) a low-pass filter receiving an output of said charge pump for outputting said phase difference voltage.

12. The phase-locked loop circuit according to claim 10, wherein said phase comparator comprises, (a-1-1-1) a first logic element having a first input end supplied with said reference signal, a second input end, and an output end for outputting an inversion of a logical product of values provided to said first input end and second input end of itself, (a-1-1-2) a second logic element having a first input end connected to said output end of said first logic element, a second input end, and an output end for outputting an inversion of a logical product of values provided to said first input end and said second input end of itself, (a-1-1-3) a third logic element having a first input end connected to said output end of said second logic element, a second input end, and an output end connected to said second input end of said second logic element for outputting an inversion of a logical product of values provided to said first input end and said second input end of itself, (a-1-1-4) a fourth logic element having a first input end connected to said output end of said first logic element, a second input end connected to said output end of said second logic element, a third input end connected to said second input end of said third logic element, and an output end connected to said second input end of said first logic element for outputting an inversion of a logical product of values provided to said first input end, said second input end and said third input end of itself as said first phase difference signal, (a-1-1-5) a fifth logic element having a first input end supplied with said signal to be measured, a second input end, and an output end for outputting an inversion of a logical product of values provided to said first input end and said second input end of itself, (a-1-1-6) a sixth logic element having a first input end connected to said output end of said fifth logic element, a second input end, and an output end for outputting an inversion of a logical product of values provided to said first input end and said second input end of itself, (a-1-1-7) a seventh logic element having a first input end connected to said output end of said sixth logic element, a second input end, and an output end connected to said second input end of said sixth logic element for outputting an inversion of a logical product of values provided to said first input end and said second input end of itself, (a-1-1-8) an eighth logic element having a first input end connected to said output end of said fifth logic element, a second input end connected to said output end of said sixth logic element, a third input end connected to said second input end of said seventh logic element, and an output end connected to said second input end of said fifth logic element for outputting an inversion of a logical product of values provided to said first input end, said second input end and said third input end of itself as said second phase difference signal, (a-1-1-9) a ninth logic element having a first input end connected to said output end of said first logic element, a second input end connected to said output end of said second logic element, a third input end connected to said output end of said fifth logic element, a fourth input end connected to said output end of said sixth logic element, and an output end for outputting an inversion of a logical product of values provided to said first input end through said fourth input end of itself, (a-1-1-10) a tenth logic element having a first input end connected to said output end of said ninth logic element, a second input end supplied with said generation control signal, and an output end for outputting an inversion of a logical product of values provided to said first input end and said second input end of itself, and (a-1-1-11) an eleventh logic element having an input end connected to said output end of said tenth logic element, and an output end connected to said second input end of said third logic element and said second input end of said seventh logic element in common for outputting an inversion of a value provided to said input end of itself.

13. The phase-locked loop circuit according to claim 11, wherein said charge pump comprises, (a-1-2-1) a first MOS transistor of a first conductivity type having a source supplied with a potential corresponding to a first logic value, a gate supplied with said first phase difference signal and a drain, and (a-1-2-2) a second MOS transistor of a second conductivity type which is complementary to said first conductivity type having a source supplied with a potential corresponding to a second logic value complementary to said first logic value, a gate supplied with an inversion of said second phase difference signal and a drain connected to said drain of said first MOS transistor, and said low-pass filter is connected to said drains of said first MOS transistor and second MOS transistor in common.

14. The phase-locked loop circuit according to claim 2, wherein said timing generating circuit counts said reference signal predetermined times and outputs said generation control signal.

15. The phase-locked loop circuit according to claim 14, wherein said timing generating circuit comprises, (b-1-1) a first gate having a first input end supplied with said reference signal, a second input end, and an output end for outputting a logical product of values provided to said first input end and said second input end of itself, (b-1-2) a first D flip-flop having a T input end connected to said output end of said first gate, a D input end, a $\overline{Q}$ output end connected to said D input end of itself and a Q output end, wherein a value applied to said Q output end is reset when said operation control signal is inactive, (b-1-2) an n-th D flip-flop ($2 \leq n \leq m$, m, n are integers) having a T input end connected to said Q output end of (n−1)-th said D flip-flop, a D input end, a $\overline{Q}$ output end connected to said D input end of itself and a Q output end, wherein a value applied to said Q output end is reset when said operation control signal is inactive, (b-1-3) a (k+1)-th gate ($1 \leq k \leq m$, k is an integer) provided corresponding to said k-th D flip-flop having a first input end connected to said $\overline{Q}$ output end of said k-th D flip-flop, a second input end supplied with a k-th logic, and an output end for outputting an inversion of a logical product of values applied to said first input end and second input end of itself, (b-1-4) a (m+2)-th gate for outputting an inversion of a logical product of said output ends of said second through said (m+1)-th gates, and (b-1-5) a (m+3)-th gate for outputting a logical product of an inversion of output of said (m+2)-th gate and said operation control signal as said generation control signal, said second input end of said first gate being supplied with an output of said (m+2)-th gate, and said first through m-th logics determining said predetermined times.

* * * * *